(12) United States Patent
Meade

(10) Patent No.: US 9,184,191 B2
(45) Date of Patent: Nov. 10, 2015

(54) METHOD PROVIDING AN EPITAXIAL PHOTONIC DEVICE HAVING A REDUCTION IN DEFECTS AND RESULTING STRUCTURE

(71) Applicant: MICRON TECHNOLOGY, INC., Boise, ID (US)

(72) Inventor: Roy Meade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 55 days.

(21) Appl. No.: 14/055,990

(22) Filed: Oct. 17, 2013

(65) Prior Publication Data

US 2015/0108596 A1  Apr. 23, 2015

(51) Int. Cl.
*H01L 31/0232* (2014.01)
*H01L 31/107* (2006.01)
*H01L 21/00* (2006.01)
*H01L 21/76* (2006.01)
*H01L 27/144* (2006.01)
*H01L 31/18* (2006.01)
*H01L 21/64* (2006.01)
*H01L 27/146* (2006.01)

(52) U.S. Cl.
CPC ............ *H01L 27/1446* (2013.01); *H01L 21/64* (2013.01); *H01L 27/14625* (2013.01); *H01L 31/18* (2013.01)

(58) Field of Classification Search
CPC ... H01L 27/14625; H01L 31/18; H01L 21/64; H01L 27/146
USPC .............................. 438/73, 401; 257/432, 438
See application file for complete search history.

(56) References Cited

U.S. PATENT DOCUMENTS

| | | | |
|---|---|---|---|
| 7,906,830 B2 | 3/2011 | Wells et al. | |
| 2011/0027950 A1* | 2/2011 | Jones et al. | 438/155 |
| 2011/0180847 A1* | 7/2011 | Ikeda et al. | 257/190 |
| 2012/0319230 A1 | 12/2012 | Liu et al. | |
| 2013/0113061 A1 | 5/2013 | Lai et al. | |
| 2013/0206962 A1 | 8/2013 | Barr et al. | |

* cited by examiner

Primary Examiner — David S Blum
(74) Attorney, Agent, or Firm — Perkins Coie LLP

(57) ABSTRACT

A method of forming a photonic device and resulting structure are described in which the photonic device is epitaxially grown over a substrate surface vertically, and laterally over trench isolation regions formed in the substrate surface.

33 Claims, 6 Drawing Sheets

METHOD PROVIDING AN EPITAXIAL PHOTONIC DEVICE HAVING A REDUCTION IN DEFECTS AND RESULTING STRUCTURE

GOVERNMENT RIGHTS

This invention was made with Government support under Agreement HR0011-11-9-0009 awarded by DARPA. The Government has certain rights in the invention.

FIELD OF THE INVENTION

Embodiments disclosed herein relate to methods of forming photodetector structures employing an epitaxial growth, and the resulting structure.

BACKGROUND OF THE INVENTION

Epitaxy refers to the deposition by growth of an overlayer on a crystalline substrate where the overlayer is in registration with the substrate. The substrate surface acts as a seed layer for the growth. Epitaxial materials may be grown from gaseous or liquid precursors. Because the substrate surface acts as a seed crystal, the epitaxial growth locks into one or more crystalline graphic orientations of the crystalline substrate. Epitaxial growth is widely used in the manufacture of integrated circuitry and may be fabricated on various types of crystalline—base materials, for example, semiconductor substrates, and of various epitaxial materials. As an example, an epitaxial silicon growth may be provided on a silicon substrate, such as bulk silicon substrates, and silicon on insulators (SOI) substrates. However, an epitaxial grown material tends to form crystalline defects, known as dislocations and stacking faults, during growth, at confined side edges of the grown material. These crystalline defects can result in undesired charge leakage within or between devices fabricated from the epitaxial material, or undesired electron-hole charge recombination sites which reduces device electrical efficiency. If the grown epitaxial material is used in forming an electro-optical photonic device, such as a photodetector, these defects may cause dark current and also reduce the efficiency of the photonic device.

One solution to the dislocation and stacking fault problem in epitaxially grown materials has been to use a particular crystal orientation of an underlying silicon layer on which the epitaxial layer is grown. For example, U.S. Pat. No. 7,906,830 describes an integrated structure in which a silicon substrate orientation is changed to "111" so that silicon crystal orientation along a confined sidewall is in the "100" direction. Although the wafer reorientation described in U.S. Pat. No. 7,906,830 can reduce dislocations and stacking faults, it is often undesirable to orient the wafer in this manner for other technical reasons, such as optimizing performance of fabricated transistors and other structures which may be formed on the substrate.

A method and resulting structure which provide an epitaxial growth of an electro-optical photonics device, such as a photodetector, with fewer dislocations and stacking faults and which does not require a particular crystal orientation of the substrate is desired.

DETAILED DESCRIPTION OF THE INVENTION

The invention provides an epitaxially grown electro-optical photonics device, such as a photodetector, and method of fabrication in which dislocation and stacking fault defects are reduced. This is accomplished by epitaxially vertically growing the photoconductor material in an opening formed above a substrate. The opening has a lateral area greater than the lateral area of a contact area of the substrate at which epitaxial growth begins. The contact area is defined between trench isolation regions which are formed at the substrate surface. The opening overlaps side edge portions of the trench isolation regions which act as projections to reduce the size of the contact area compared to that of the opening and provides an area for lateral stress relief during growth of the photoconductor. The trench isolation regions may be deep trench isolation regions or shallow trench isolation (STI) regions commonly used to isolate active devices in an electronic integrated circuit. The photodetector material, e.g., germanium or silicon-germanium, can epitaxially grow vertically up from the contact area and also laterally over the side edge within the opening portions of trench isolation regions. The stress relief provided during epitaxial grown results in fewer side edge dislocations and stacking faults in the photoconductor.

Embodiments of a method of fabricating the photodetector and the resulting structure are now described in connection with FIGS. 1 through 8A. It should be understood that the specific materials and material layers described below are examples of materials and material layers which can be used; however, the invention is not limited to these specific materials and material layers. Also, although a photodetector is described herein as one kind of electro-optical photonic device which can be fabricated from an epitaxial growth, the method and structured embodiments described herein are not limited to forming a photodetector and can be used in an epitaxial growth to form other electro-optical photonic devices such as modulators, demodulators, mixers, multiplexes, demultiplexer, and others.

Figure 1:
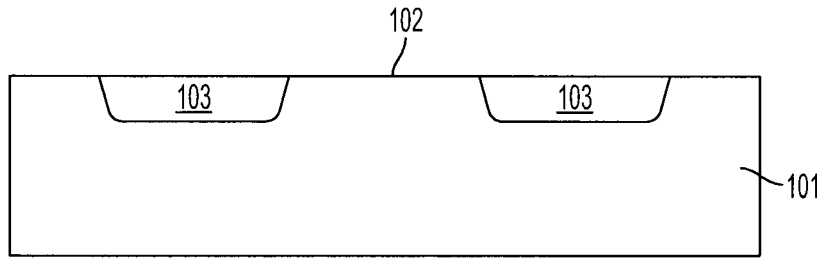
FIG. 1 illustrates in cross-section a starting structure for forming an electro-optical photonic device in accordance with an embodiment of the invention.

FIG. 1 illustrates a starting structure which includes a bulk semiconductor substrate 101 in which trench isolation regions 103 are formed. Although the trench isolation regions may be of any desired depth, e.g., deep or shallow trench isolation region, for convenience the isolation regions are described below as shallow trench isolation (STI) regions which are typically used to isolate electronic devices in an integrated circuit. The substrate 101 can be of uniform semiconductor material, for example, a bulk crystalline silicon substrate, or it can be formed of a silicon on insulator (SOI) substrate, or other semiconductor substrates, as used in the electronics or photonics industry.

The shallow trench isolation (STI) regions 103 are formed in an upper surface of substrate 101. The STI regions 103 may be formed by conventional processes which include forming a trench in semiconductor substrate 101 and filling it with dielectric material, for example, a silicon oxide. After the STI regions 103 are formed, the surface of the substrate 101 may be planarized providing a smooth flat surface for fabrication of subsequent layers. Alternatively, the upper surface of STI regions 103 may be higher than or recessed lower than the level of the upper surface 102 of substrate 101.

Figure 2:
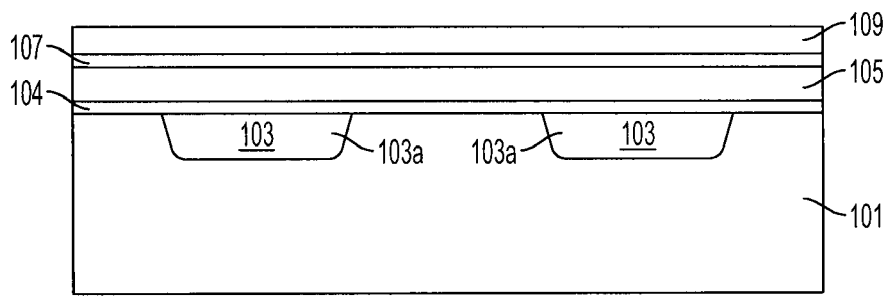
FIG. 2 illustrates in cross-section of the FIG. 1 structure at a subsequent stage of processing.
Figure 3:
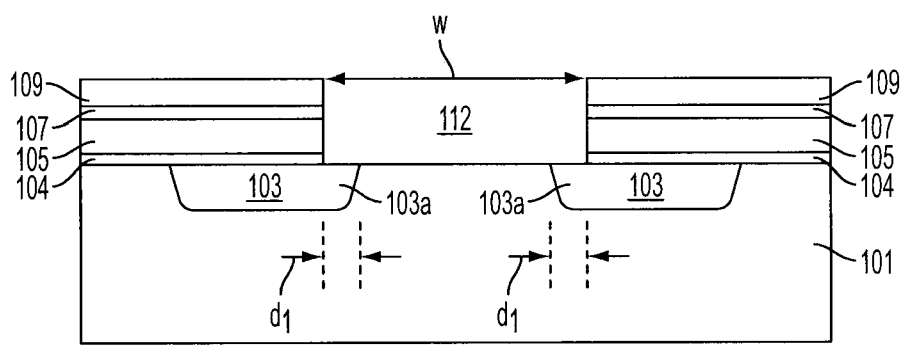
FIG. 3 illustrates a cross-section of the FIG. 2 structure at a subsequent stage of processing.

FIG. 2 illustrates the sequential formation of an oxide 104, a polysilicon 105, which can be fabricated as a waveguide core, and a dielectric 107 which will act as the side and upper cladding for the polysilicon 105 waveguide core. The oxide 104, polysilicon 105 and dielectric 107 provide the waveguide. The dielectric material in 104 and 107 may be a silicon oxide such as silicon dioxide. A further dielectric layer 109 which may serve as a passivation material and which may be formed of silicon nitride can be formed over the dielectric 107. The structure illustrated in FIG. 2 is then anisotropically etched using a mask to form an opening 112 which has a width w which extends over and beyond the side edges 103a of the STI regions 103 by a distance d1 illustrated in FIG. 3.

Figure 4:
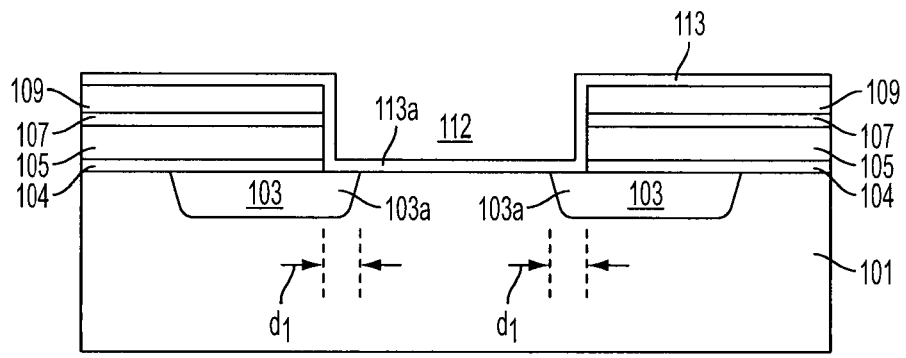
FIG. 4 illustrates a cross-section of the FIG. 3 structure at a subsequent stage of processing.
Figure 5:
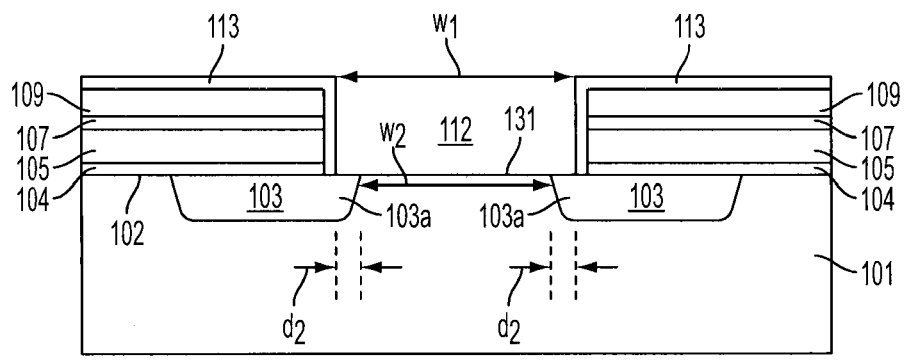
FIG. 5 illustrates a cross-section of the FIG. 4 structure at a subsequent stage of processing.

As illustrated in FIG. 4, the opening 112 and upper surface of dielectric layer 109 is lined with a light transmissive dielectric liner 113 of an oxide material, for example, silicon dioxide. Alternatively, the dielectric liner 113 can be formed of a light transmissive silicon nitride. The bottom 113a of the dielectric liner 113 within opening 112 is then removed to expose a contact area 131 at the surface 102 of substrate 101 and which is between the upper surfaces of the side edges 103a of the STI regions over which the opening 112 extends. FIG. 5 illustrates the removal of the dielectric liner 113 at the bottom of the opening 112. The dielectric liner 113 remains on the opening sidewalls to keep the polysilicon 105 from acting as a seed during subsequent epitaxial growth within opening 112. By extending over the side edges 103a of the shallow trench isolation regions 103, the lateral area of opening 112 is larger laterally than the lateral area of contact area 131. Thus, the width of opening 112 $w_1$ is larger than the width $w_2$ of the contact area 131. FIG. 5 also shows that although liner 113 narrows opening 112 somewhat, the opening 112 still overlaps side edges 103a of the shallow trench isolation regions 103 by a distance $d_2$.

Figure 6:
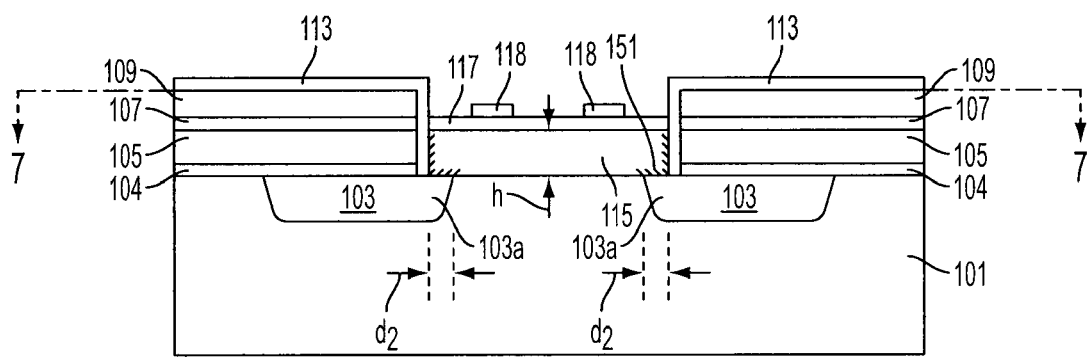
FIG. 6 illustrates a cross-section of the FIG. 5 structure at a subsequent stage of processing.

Next, and as shown in FIG. 6, a material for forming a photodetector 115 is epitaxially grown within the opening 112. The grown material can be germanium or silicon/germanium, or other material, such as GaN, InP, InGaAs, and others, which can be used to form a photodetector or other photonics device, as known in the art. Importantly, epitaxial growth of the photodetector material proceeds both vertically as well as laterally. The lateral growth causes portions of photodetector material to grow over side edge portions 103a of the STI regions 103 which project inwardly of the opening 112 to form a ledge. The lateral area $d_2$, shown in FIG. 6, provides stress relief during growth of the photodetector 115 and reduces the occurrence of dislocations and stacking faults at the side edges of the grown photodetector 115. In addition, because of the overlap $d_2$, side edges of the photoconductor 115, which may still include some dislocation and stacking fault defects 151, are moved away from a more central location of the photodetector 115 to an area less likely to have charge movement. Since a greater number of stacking faults and dislocations are also likely to occur in the corner 151 of the dielectric liner 113 sidewall and upper surface of the shallow trench isolation regions, the height h of the photoconductor 115 is sufficient to minimize electrical effects of the stacking faults and dislocations at the corner areas 151. Accordingly, there are again fewer defects where most of the photoconversion activity within the photodetector 115 will occur. In general, the height h of the grown photoconductor material 115 can be in an approximately 1:1 ratio with the distance $d_2$ of the side edge projections 103a over which growth occurs. The term approximately encompasses up to a 10% (plus or minus) difference in the 1:1 ratio.

FIG. 6 also illustrates the formation of a capping material 117 over the photodetector 115 with the capping material being formed, for example, of silicon which can form, with an overlying patterned metal 118, and heat treatment, a silicide to provide good ohmic contact to the photodetector 115. The photodetector 115 is appropriately optically aligned with the polysilicon 105 waveguide core and thus is able to optically detect and convert optical signals passing through polysilicon 105.

Figure 7:
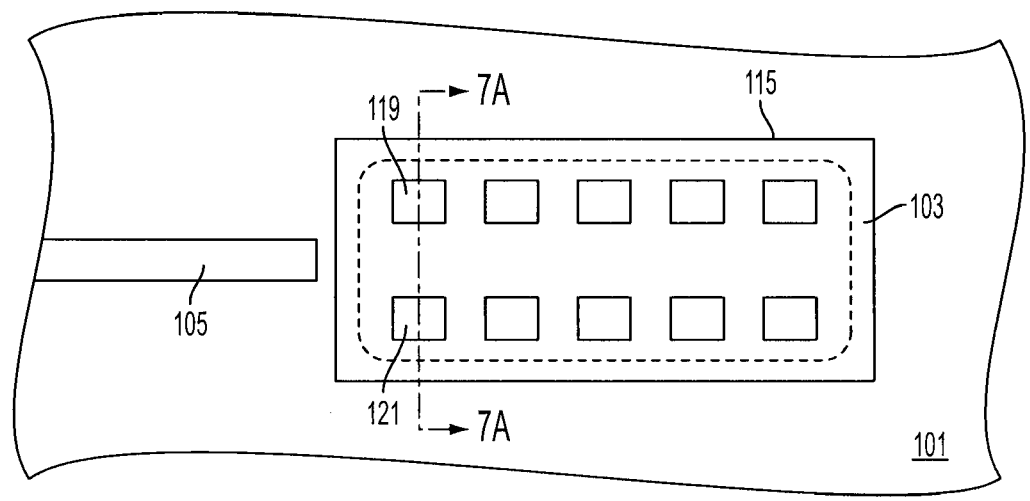
FIG. 7 illustrates a planar view of the FIG. 6 structure, with electrodes along the lines 7-7 in FIG. 6.
Figure 7A:
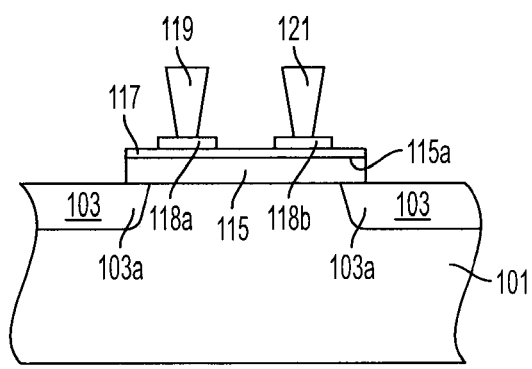
FIG. 7A illustrates a cross-sectional view along the lines 7A-7A in FIG. 7, showing the electrodes in greater detail.

As shown in the planar and cross-sectional views of FIG. 7, 7A the upper surface 115a of the photodetector 115 may be provided with a plurality of paired electrodes 119, 121 which contact with respective portions 118a, 118b of silicide 118. The edges of the STI areas 103 are illustrated, in both FIG. 7 and FIG. 8, by the dotted lines and the photodetector 115 is illustrated by a solid line. The cross-section of FIG. 7A has been simplified to just show the electrode connection to photodetector 115. Electrode 119 is a doped n-plus contact electrode and electrode 121 is a doped p-plus contact electrode. These contact electrodes receive an electrical signal output from the photodetector 115 through silicide contact areas 118a, 118b. FIG. 7A illustrates the pair of electrodes 119 and 121, arranged to form a lateral photodetector 115. A lateral photodetector 115 has both electrodes on the upper surface of the photodetector 115 and over an area of the substrate between the STI regions 103 and spaced away from the side edges of the epitaxially grown photodetector 115.

Figure 8:
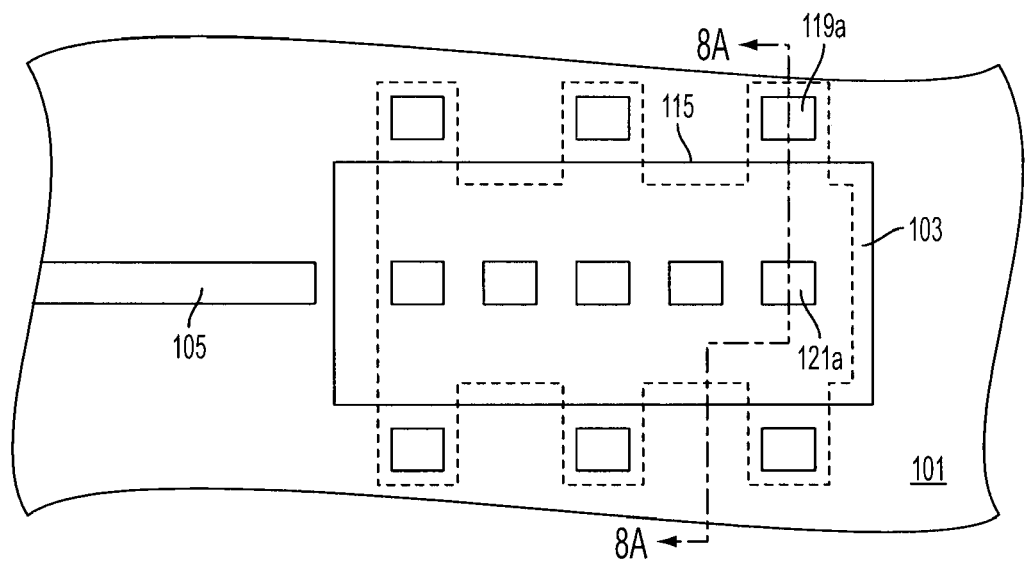
FIG. 8 illustrates a planar view of the FIG. 6 structure with a different arrangement of electrodes, along the lines 7-7 in FIG. 6.
Figure 8A:
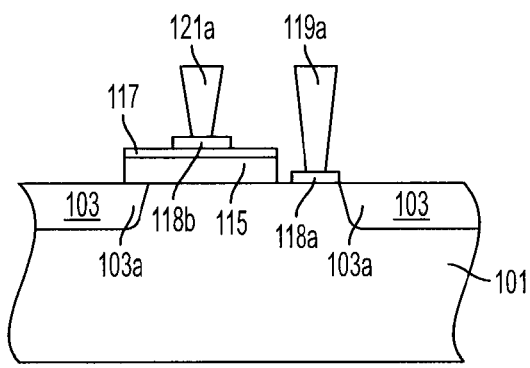
FIG. 8A illustrates a cross-sectional view along the lines 8A-8A in FIG. 8; and, FIG. 9 illustrates a cross-section of another embodiment.

FIG. 8 illustrates a planar view of another electrode embodiment in which n-plus contacts 119a and p-plus contacts 121 to connect respective silicide areas 118a, 118b. As shown in FIG. 8 and the cross-section of FIG. 8A, the two electrodes 119a and 121a are shown in an arrangement which provides a vertical photodetector 115. In this case, the two electrodes are provided over silicide regions 118a, 118b. One electrode 121a is provided on the upper surface of photodetector 115 and the other electrode 119a is provided on the upper surface of the substrate 101.

In the embodiments described above opening 112 is formed within a structure which can provide a waveguide having a polysilicon 105 as the waveguide core and with oxides 104 and 107 providing cladding surrounding the waveguide core. In the illustrated FIG. 6 structure, one or all of the materials 104, 105, 107, 109 over the substrate 101 on either side of photodetector 115 can be sacrificial layers and removed after the photodetector 115 and before or after associated electrodes 119 (119a) and 120 (120a) are formed.

Figure 9:
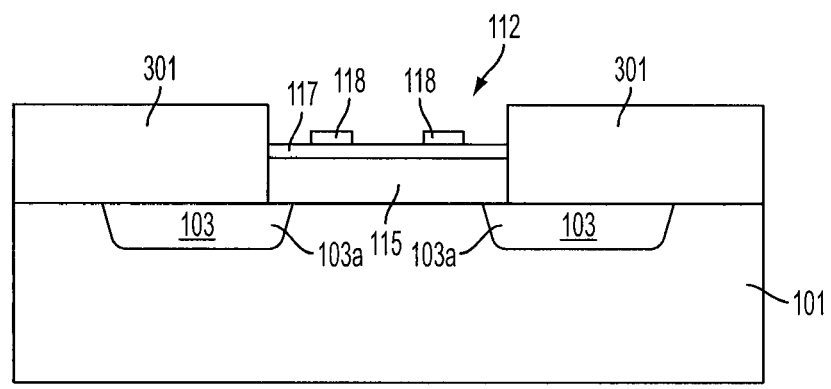

It should be noted that opening 112 to the surface of substrate 101 can be formed in any materials provided over the substrate 101, whether those materials are used to fabricate photonic structures, such as a waveguide or other structures, or used as sacrificial material to provide a confined area for photodetector 115 epitaxial growth, which are removed after the epitaxial growth. Thus, in another embodiment, FIG. 9 shows a structure in which an opening 112 is formed in a sacrificial dielectric 301, which may be an oxide or silicon nitride. In this embodiment the lateral area of opening 112 is again wider than the lateral area of the seed contact area at the upper surface of substrate 101, and which is defined by the edges 103a of the trench isolation regions 103. During epitaxial growth the photodetector 115 material grows vertically and laterally over the projecting edges 103a of the isolation regions. After epitaxial growth is completed, a doped silicon material such as a doped polysilicon 117 can be provided and a patterned metal 118 formed over the polysilicon layer 117 which is silicided to form contact areas to the photodetector 115 in the manner shown in FIGS. 7, 7A and 8, 8A.

Figure 10:
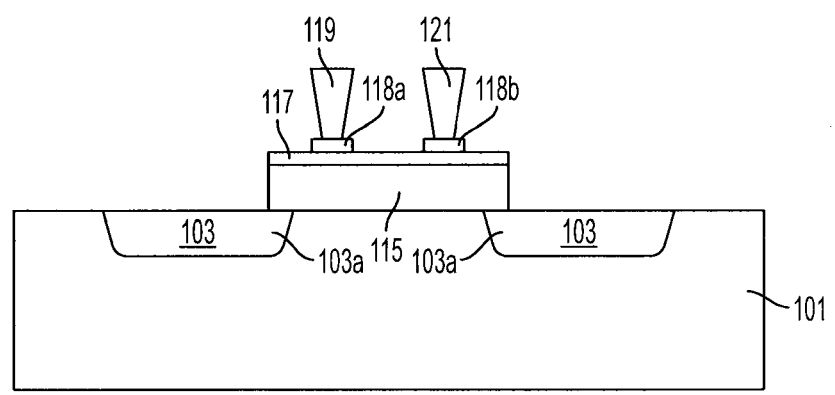
FIG. 10 illustrates the FIG. 9 structure at a subsequent stage of processing.

The dielectric material 301 can then be removed using known techniques, leaving the photodetector 115 shown in FIG. 10. Also, although FIG. 9 shows a single dielectric material 301, any number of same or different materials can be used for the sacrificial dielectric 301. For example, the dielectric material 301 can be homogenous or deposited as a laminate of different or similar materials.

As is apparent, other techniques and structures can also be used which rely on growing an epitaxial photodetector 115 within opening 112 provided over a contact area defined by projecting portions of isolation regions 103, such that the opening 112 has a layer lateral area than that of the contact area. This provides stress relief during vertical growth by providing a region for lateral growth as well.

Figure 11:
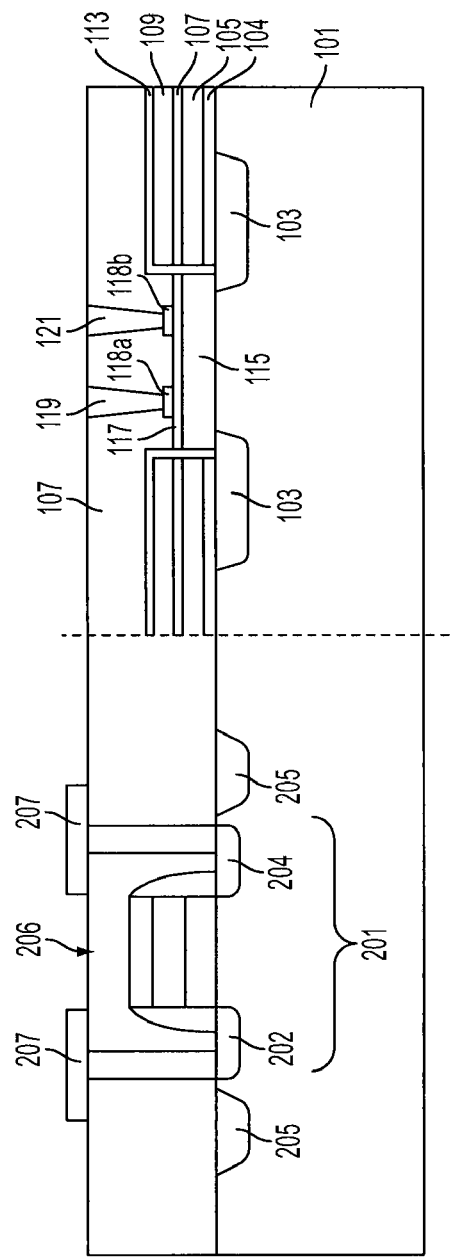
FIG. 11 illustrates a cross-section of a hybrid integrated circuit structure which includes a photonics area and a CMOS circuit area.

FIG. 11 shows a hybrid integrated circuit containing both CMOS electrical circuits on the left and photonics circuits on the right which include the photodetector 115 as described above. The CMOS circuit is represented in FIG. 11 by a transistor 201 having a source 202 and drain 204 and a gate structure 206. The source 202 ad drain 204 are connected by way of conductive vias to respective mutual terminal pads 207 which connect with other metallized wiring pattern on the CMOS circuit side. An insulating dielectric 107, for example of BPSG or PSG, is formed over the transistor 201 and provides a surface on which terminal pads 207 are formed. Shallow trench isolation regions 205 may be formed within substrate 101 to electrically isolate transistor 201. The shallow trench isolation regions 205 may be formed at the same time, as the shallow trench isolation regions 103. The photonics circuit is depicted as having the structure described above with respect to FIG. 6, and with the dielectric 107 formed over the FIG. 6 structure and with electrodes 119, 121 extending to the upper surface of insulating dielectric 107.

Because the side edges 103a of the shallow trench isolation regions 103 form a ledge over which lateral epitaxial growth can occur, the amount of stacking and dislocation faults at the side edges of photodetector 115 are reduced. In addition, such faults are moved further away from the center of the photodetector where photoconversion occurs. Accordingly, improved photodetector photoconversion efficiency is obtained.

Although the invention has been described with reference to specific materials which can be used in the various embodiments, the invention is not so limited as many modifications and substitutions can be made. For example, other semiconductor materials can be used for the substrate 101 besides silicon and other known photodetector materials may be epitaxially grown on the substrate surface to form photodetector 115 or other photonics device. In addition, many different materials and number of material layers can be formed over the substrate as sacrificial or non-sacrificial layers in which the opening 112 to the substrate surface 102 is formed. The trench isolation regions 103 can also be filled with any known dielectric material.

Accordingly, the invention is not limited by the foregoing description but is limited solely by the scope of the appended claims.

What is claimed as new and desired to be protected by Letters Patent of the United States is:

1. A photonic structure comprising:
   a semiconductor substrate comprising spaced trench isolation regions which define between them a semiconductor contact region at the upper surface of the substrate;
   an epitaxial photonic device formed over and in contact with the contact region and with upper surfaces of side edges of the spaced trench isolation regions such that side edges of the photonic device extend over the side edges of the spaced trench isolation regions.

2. A photonic structure as in claim 1, wherein the photonic device comprises a photodetector.

3. A photonic structure as in claim 1, wherein the spaced trench isolation regions comprises shallow trench isolation regions.

4. A photonic structure as in claim 1, which is integrated on a common substrate with electronic circuits.

5. A photonic structure as in claim 1, wherein the substrate comprises a crystalline silicon substrate.

6. A photonic structure as in claim 2, further comprising a waveguide, formed over the substrate in optical communication with the photodetector.

7. A photonic structure as in claim 2, wherein the photodetector comprises a material selected from the group consisting of germanium, and silicon/germanium.

8. A photonic structure as in claim 2, wherein the spaced trench isolation regions comprise shallow trench isolation regions.

9. A photonic structure as in claim 2, further comprising a doped silicon material over the photodetector.

10. A photonic structure as in claim 2, wherein the photodetector has a height and overlaps side edges of each of the trench isolation regions by a distance which is in approximately a 1:1 relationship with the height.

11. A photonic structure as in claim 6, further comprising a light transmissive dielectric between the waveguide and a side edge of the photodetector.

12. A photonic structure as in claim 6, wherein a core of the waveguide comprises polysilicon.

13. A photonic structure as in claim 10, further comprising:
   a first doped contact of a first conductivity type and a second doped contact of an opposite conductivity type, wherein the first and second doped contacts are in electrical communication with an upper surface of the photodetector.

14. A photonic structure as in claim 10, further comprising:
   a first doped contact of a first conductivity type and a second doped contact of an opposite conductivity type, wherein the first doped contact is in electrical communication with an upper surface of the photodetector and the second doped contact is in electrical communication with an upper surface of the substrate.

15. A photonic structure as in claim 2, wherein the photodetector comprises a material selected from the group consisting of GaN, InP, and InGaAs.

16. A photonic structure comprising:
   a crystalline silicon substrate comprising spaced shallow trench isolation regions at an upper surface which define between them a semiconductor contact region at the upper surface of the substrate; and, an epitaxial photodetector in contact with the contact region between the spaced shallow trench isolation regions, the photodetector being in contact with and overlapping upper surfaces of the spaced shallow trench isolation regions.

17. A photonic structure as in claim 16, further comprising:
a waveguide formed over the substrate an in optical communication with the photodetector.

18. A photonic structure as in claim 17, wherein the waveguide comprises a polysilicon core and dielectric cladding materials around the core.

19. A photonic structure as in claim 16, wherein the photodetector has lower corner defect areas and a height which is greater than a height of the lower corner defect areas.

20. A photonic structure as in claim 16, wherein the photodetector has a height and overlaps each of the shallow trench isolation regions by a distance which is in approximately a 1:1 relationship with the height.

21. A photonic structure as in claim 16, which is integrated on a common substrate with an electrical circuit.

22. A method of forming a photonic device, the method comprising:
forming spaced trench isolation regions in an upper surface of a semiconductor substrate;
forming at least one material over the substrate;
forming an opening in the at least one material at a location over the substrate between the spaced trench isolation regions, the opening extending to an upper surface of the substrate and laterally over side edge portions of the spaced trench isolation regions; and
epitaxially growing a photonic device on the upper surface of the substrate within the opening and over the side edge portions of the spaced trench isolation regions.

23. A method as in claim 22, wherein the at least one material comprises a waveguide, the method further comprising lining sidewalls of the opening with a dielectric material before epitaxially growing the photonic device.

24. A method of forming a photonic device as in claim 22, wherein the photonic device is a photodetector.

25. A method of forming a photonic device as in claim 22, wherein the semiconductor substrate comprises a crystalline silicon substrate and the photodetector comprises epitaxially grown silicon-germanium or germanium.

26. A method of forming a photonic device as in claim 22, wherein the photonic device is epitaxially grown to a level recessed below an upper surface defining the opening, the method further comprising forming a silicon material within the opening and over the photodetector.

27. A method of forming a photonic device as in claim 23, wherein the waveguide comprises a polysilicon core and cladding material around the core.

28. A method of forming a photonic device as in claim 23, wherein the photodetector has a height and overlaps the side edges of the trench isolation regions by a distance in approximately a 1:1 relationship with the height.

29. A method of forming a photonic device as in claim 24, further comprising forming a first doped contact of a first conductivity type and a second doped contact of an opposite conductivity type, the first and second doped contacts being in electrical communication with an upper surface of the photodetector.

30. A method of forming a photonic device as in claim 24, further comprising forming a first doped contact of a first conductivity type and a second doped contact of an opposite conductivity type, wherein the first doped contact is in electrical communication with an upper surface of the photodetector and the second doped contact is in electrical communication with an upper surface of the substrate.

31. An integrated structure comprising:
a semiconductor substrate comprising spaced trench isolation regions which define between them a semiconductor contact region at the upper surface of the substrate;
an epitaxial device formed over and in contact with the contact region and with upper surfaces of side edges of the spaced trench isolation regions such that side edges of the epitaxial device extend over the side edges of the spaced trench isolation regions.

32. An integrated structure as in claim 31, wherein the spaced trench isolation regions comprises shallow trench isolation regions.

33. An integrated structure as in claim 31, wherein the epitaxial device has a height and overlaps each of the side edges of the trench isolation regions by a distance which is in approximately 1:1 relationship with the height.

* * * * *